US012802727B2

(12) United States Patent
Wang et al.

(10) Patent No.: US 12,802,727 B2
(45) Date of Patent: Nov. 17, 2026

(54) COMPUTE-IN-MEMORY CIRCUIT AND CONTROL METHOD THEREOF

(71) Applicant: Peking University, Beijing (CN)

(72) Inventors: Zongwei Wang, Beijing (CN); Yimao Cai, Beijing (CN); Yunfan Yang, Beijing (CN); Linbo Shan, Beijing (CN); Ru Huang, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 107 days.

(21) Appl. No.: 18/629,556

(22) Filed: Apr. 8, 2024

(65) Prior Publication Data

US 2024/0339138 A1 Oct. 10, 2024

(30) Foreign Application Priority Data

Apr. 7, 2023 (CN) ......................... 202310364014.0

(51) Int. Cl.
*G11C 7/16* (2006.01)
*G11C 7/10* (2006.01)

(52) U.S. Cl.
CPC .............. *G11C 7/16* (2013.01); *G11C 7/1012* (2013.01)

(58) Field of Classification Search
CPC ................................ G11C 7/16; G11C 7/1012
IPC ............................................ G11C 7/16,7/1012
See application file for complete search history.

(56) References Cited

U.S. PATENT DOCUMENTS 7,562,198 B2 * 7/2009 Noda .................. G11C 7/1006
711/154
9,430,735 B1 * 8/2016 Vali .................... G11C 16/0483
11,935,586 B2 * 3/2024 Fujiwara ............... G11C 11/419
2011/0211390 A1 9/2011 Hanzawa et al.
(Continued)

FOREIGN PATENT DOCUMENTS

CN 1144385 A 3/1997
CN 114242151 A 3/2022
(Continued)

OTHER PUBLICATIONS

Wang, Y. et al., "Progresses and outlook in neuromorphic devices," Chin Sci Bull, 2020, 65: 904-915 (English abstract and summary; Cited in CN Decision of Grant).
(Continued)

*Primary Examiner* — Vanthu T Nguyen
(74) *Attorney, Agent, or Firm* — HSML.P.C.

(57) ABSTRACT

A compute-in-memory (CIM) circuit and a control method thereof. The CIM circuit includes a memory array. The memory array comprises $n_1$ memory blocks arranged in sequence from top to bottom, and each memory block comprises $n_2$ rows of memory-cell rows arranged in sequence, wherein $n_1 \geq 2$, $n_2 \geq 1$. Each odd memory block and an adjacent even memory block arranged therebelow form a memory group. Each memory group comprises $n_2$ pairs of memory-cell rows, and a k-th pair of memory-cell rows in each memory group includes a k-th memory-cell row and a $(2n_2+1-k)$-th memory-cell row in the corresponding memory group, where $1 \leq k \leq n_2$. The memory array is divided into $n_2$ memory subarrays configured to be turned on in sequence for calculation, wherein a k-th memory subarray includes the k-th pair of memory-cell rows in each memory group.

8 Claims, 8 Drawing Sheets

(56) References Cited

U.S. PATENT DOCUMENTS

| | | | |
|---|---|---|---|
| 2018/0046598 | A1 | 2/2018 | Le Gallo et al. |
| 2022/0398438 | A1 | 12/2022 | Zhang et al. |

FOREIGN PATENT DOCUMENTS

| | | | |
|---|---|---|---|
| CN | 114388021 | A | 4/2022 |
| CN | 115148234 | A | 10/2022 |
| CN | 115831170 | A | 3/2023 |

OTHER PUBLICATIONS

Decision of Grant issued for Chinese Patent Application No. 202310364014.0, dated Feb. 9, 2024, 9 pages including English machine translation.

* cited by examiner

COMPUTE-IN-MEMORY CIRCUIT AND CONTROL METHOD THEREOF

CROSS-REFERENCE TO RELATED APPLICATION

The present application claims the priority of Chinese patent application No. 202310364014.0, filed on Apr. 7, 2023, and entitled "Memory Array Balancing Influence of Voltage Drop", which is incorporated herein by reference in its entirety.

TECHNICAL FIELD

The application belongs to the technical field of memory and Compute-In-Memory (CIM) in semiconductor and in CMOS Ultra Large-Scale Integration.

BACKGROUND

With the development of artificial intelligence and deep learning technology, artificial neural networks have been widely used in fields such as natural language processing, image recognition, autonomous driving, and graph neural networks. However, the increasing size of the network causes a consumption of large amount of energy during a transfer of data between the memory and the traditional processing device such as CPU or GPU, which is known as the von Neumann bottleneck. The computation that occupies the most significant part of the artificial neural network algorithm is the matrix-vector multiplication. In a CIM based on memory array, weights are stored in memory cells and matrix-analog-vector multiplication is processed in the array, which avoids the frequent transfers of data between the memory and the processing unit, and is considered to be a promising solution to the problem of von Neumann bottleneck.

SUMMARY

The present disclosure provides a compute-in-memory (CIM) circuit. The CIM circuit includes a memory array. The memory array includes $n_1$ memory blocks arranged in sequence from top to bottom, and each memory block includes $n_2$ rows of memory-cell rows arranged in sequence, wherein $n_1 \geq 2$, $n_2 \geq 1$.

Each odd memory block and an adjacent even memory block arranged therebelow form a memory group.

Each memory group includes $n_2$ pairs of memory-cell rows, and a k-th pair of memory-cell rows in each memory group includes a k-th memory-cell row and a $(2n_2+1-k)$-th memory-cell row in the corresponding memory group, and it is satisfied that $1 \leq k \leq n_2$.

The memory array is divided into $n_2$ memory subarrays configured to be turned on in sequence, where a k-th memory subarray includes the k-th pair of memory-cell rows in each memory group.

In one of the embodiments, the CIM circuit further includes multiple complementary multiplexer (MUX) groups. Each complementary MUX group includes an MUX and a flip-flop MUX. Outputs of the MUX and outputs of the flip-flop MUX in each complementary MUX group are connected to the memory-cell rows of a memory group in a one-to-one correspondence.

In one of the embodiments, the outputs of the MUX in each complementary MUX group are connected to memory-cell rows in an odd memory block of a memory group in a one-to-one correspondence. The outputs of the flip-flop MUX in a corresponding complementary MUX group are connected to memory-cell rows in an even memory block of a corresponding memory group in a one-to-one correspondence.

In one of the embodiments, each complementary MUX group includes at least N control lines, and the MUX and the flip-flop MUX in each complementary MUX group share the at least N control lines, and $2^N=n_2$.

In one of the embodiments, the CIM circuit further includes multiple digital-to-analog converters (DACs) or buffers, and an output of each DAC or buffer is connected to a memory-cell row of the memory array.

In one of the embodiments, the CIM circuit further includes multiple ADCs, and inputs of the multiple ADCs are connected to bit lines (BLs) of the memory array, respectively.

In one of the embodiments, the CIM circuit further includes a controller, and the controller is connected to each complementary MUX group through a plurality of control lines.

In one of the embodiments, each memory-cell row includes multiple memory cells.

In one of the embodiments, $n_1$ is an even number.

In one of the embodiments, the $n_2$ rows of memory-cell rows in each memory block are arranged in sequence at equal intervals.

In one of the embodiments, the multiple memory cells are SRAM or DRAM volatile memory cells, or FLASH, RRAM, PCRAM, or MRAM non-volatile memory cells.

The present disclosure further provides a control method of CIM circuit. The control method of CIM circuit includes: dividing a memory array into $n_1$ memory blocks in sequence from top to bottom, and arranging $n_2$ rows of memory-cell rows in sequence in each memory block, where $n_1 \geq 2$, $n_2 \geq 1$; forming a memory group by each odd memory block and an adjacent even memory block arranged therebelow; dividing each memory group into $n_2$ pairs of memory-cell rows, and forming a k-th pair of memory-cell rows in each memory group by a k-th memory-cell row and a $(2n_2+1-k)$-th memory-cell row in the corresponding memory group, wherein $1 \leq k \leq n_2$; forming a k-th memory subarray by the k-th pair of memory-cell rows in each memory group; and controlling memory subarrays to be turned on in turn for calculation.

In one of the embodiments, before dividing the memory array into $n_1$ memory blocks in sequence from top to bottom, and arranging the $n_2$ rows of memory-cell rows in sequence in each memory block, the control method of CIM circuit further includes: setting the number $n_2$ of rows of memory-cell rows arranged in sequence in each memory block to be the same as the number of times of turning on the memory subarrays in sequence for calculation; and calculating the number of memory blocks to be $$n_1 = \frac{n}{n_2},$$

according to a total row number n of the memory-cell rows in the memory array and the number $n_2$ of rows of memory-cell rows arranged in sequence in each memory block.

In one of the embodiments, the control method of CIM circuit further includes arranging the $n_2$ rows of memory-cell rows in each memory block at equal intervals in sequence.

In one of the embodiments, controlling the memory subarrays to be turned on in turn for calculation includes: controlling a first memory subarray, a second memory subarray, a third memory subarray, and a fourth memory subarray to be turned on in sequence for calculation.

The technical effects of the present disclosure are as follows: the CIM circuit of the present disclosure includes a memory array. The memory array includes $n_1$ memory blocks arranged in sequence from top to bottom, and each memory block includes $n_2$ rows of memory-cell rows arranged in sequence, wherein $n_1 \geq 2$, $n_2 \geq 1$. Each odd memory block and an adjacent even memory block arranged therebelow form a memory group. Each memory group includes $n_2$ pairs of memory-cell rows, and a k-th pair of memory-cell rows in each memory group includes a k-th memory-cell row and a $(2n_2+1-k)$-th memory-cell row in the corresponding memory group, and it is satisfied that $1 \leq k \leq n_2$. The memory array is divided into $n_2$ memory subarrays configured to be turned on in sequence for calculation, where a k-th memory subarray includes the k-th pair of memory-cell rows in each memory group. When the memory array is computing, the memory subarrays may be controlled to be turned on in turn for calculation. The k-th memory subarray, as an example of the memory subarray controlled to be turned on each time, is formed by the k-th row of memory-cell row and the $(2n_2+1-k)$-th row of memory-cell row selected from each memory group, where $1 \leq k \leq n_2$. Accordingly, for each memory group, a sum of in-group sequence numbers of the memory-cell rows forming a memory subarray is equal to a sum of in-group sequence numbers of memory-cell rows forming any other memory subarray, and the sum is a constant $2n_2+1$. Thus, it may be ensured that, for each memory group, a resistance sum of BLs connecting a pair of memory-cell rows forming a memory subarray to other circuit devices arranged at the bottom is equal to a resistance sum of BLs connecting a pair of memory-cell rows forming any other memory subarray to other circuit devices arranged at the bottom. Accordingly, the memory array is finally divided into $n_2$ non-overlapped memory subarrays, and a sum of in-memory-array row sequence numbers of all memory-cell rows in each memory subarray, is the same, that is, a total resistance of the BLs connecting all memory-cell rows in the memory subarray to other circuit devices arranged at the bottom is the same, thereby effectively balancing the impact of the voltage drop during the calculation of each memory subarray, and reducing the deviation of the calculation result of the memory array caused by the unbalanced voltage drops.

DETAILED DESCRIPTION OF THE EMBODIMENTS

In order to make the purposes, technical solutions and advantages of the embodiments of the present disclosure clearer, the technical solutions of the present disclosure will be described clearly and completely hereinafter with reference to the drawings of the embodiments. Obviously, the described embodiments are part of the embodiments of the disclosure, rather than all embodiments. Based on the embodiments in the disclosure, all other embodiments obtained by those of ordinary skill in the art without involving creative work fall within the scope of protection of the disclosure.

Figure 1:
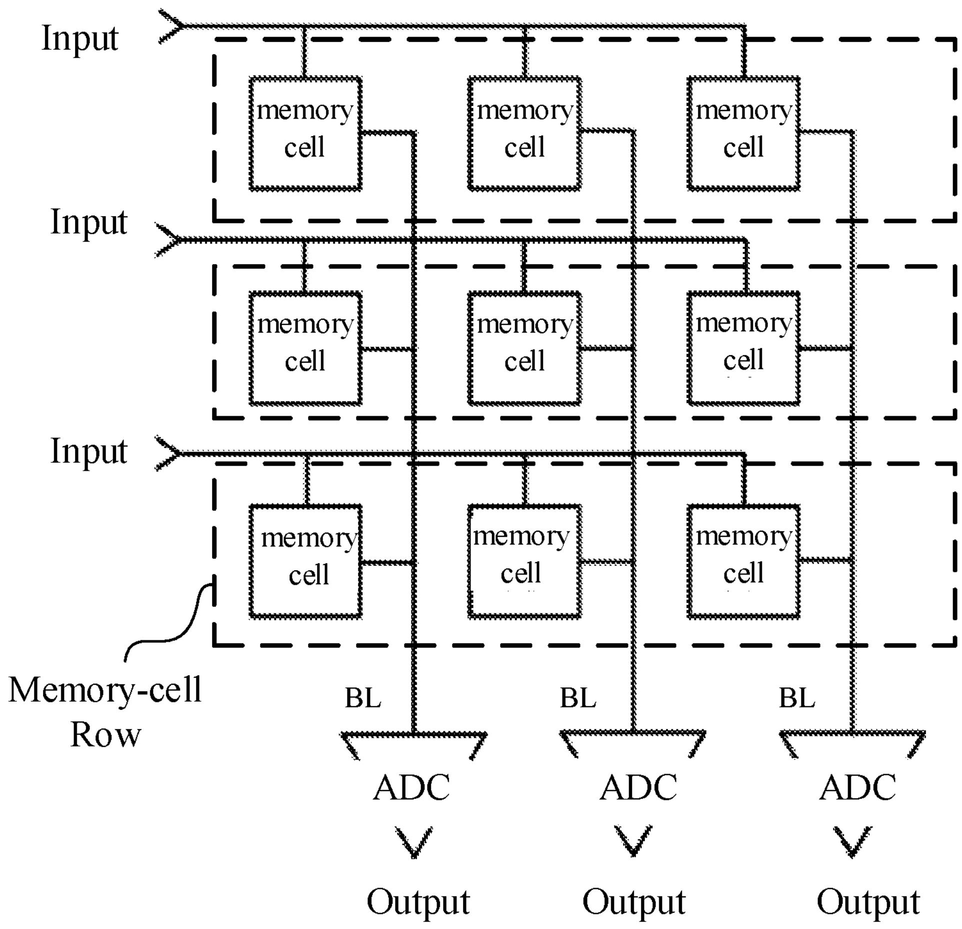
FIG. 1 is a schematic view of a CIM circuit based on a memory array according to an embodiment of the disclosure.

FIG. 1 is a schematic view of a compute-in-memory (CIM) circuit based on a memory array according to an embodiment of the disclosure. The memory array includes a plurality of memory-cell rows, and each memory-cell row includes a plurality of memory cells. When the memory array is used for calculation, for example, to process a matrix-vector multiplication, the weights for the matrix-vector multiplication are stored in the memory cells, respectively. The calculation result of the memory array is represented by a voltage or a current in a bit line (BL). The analog voltage or the analog current is processed, for example, is converted into a digital signal, and then the calculation result is outputted. Usually, due to the existence of current in the BL, the current causes a voltage drop in the BL, which may further affect the accuracy of the calculation result of the memory array. In order to limit the current in the BL, usually the memory array would not be entirely turned on for calculation at the same time, but only one memory subarray including part of the memory-cell rows is turned on for calculation each time.

Figure 2:
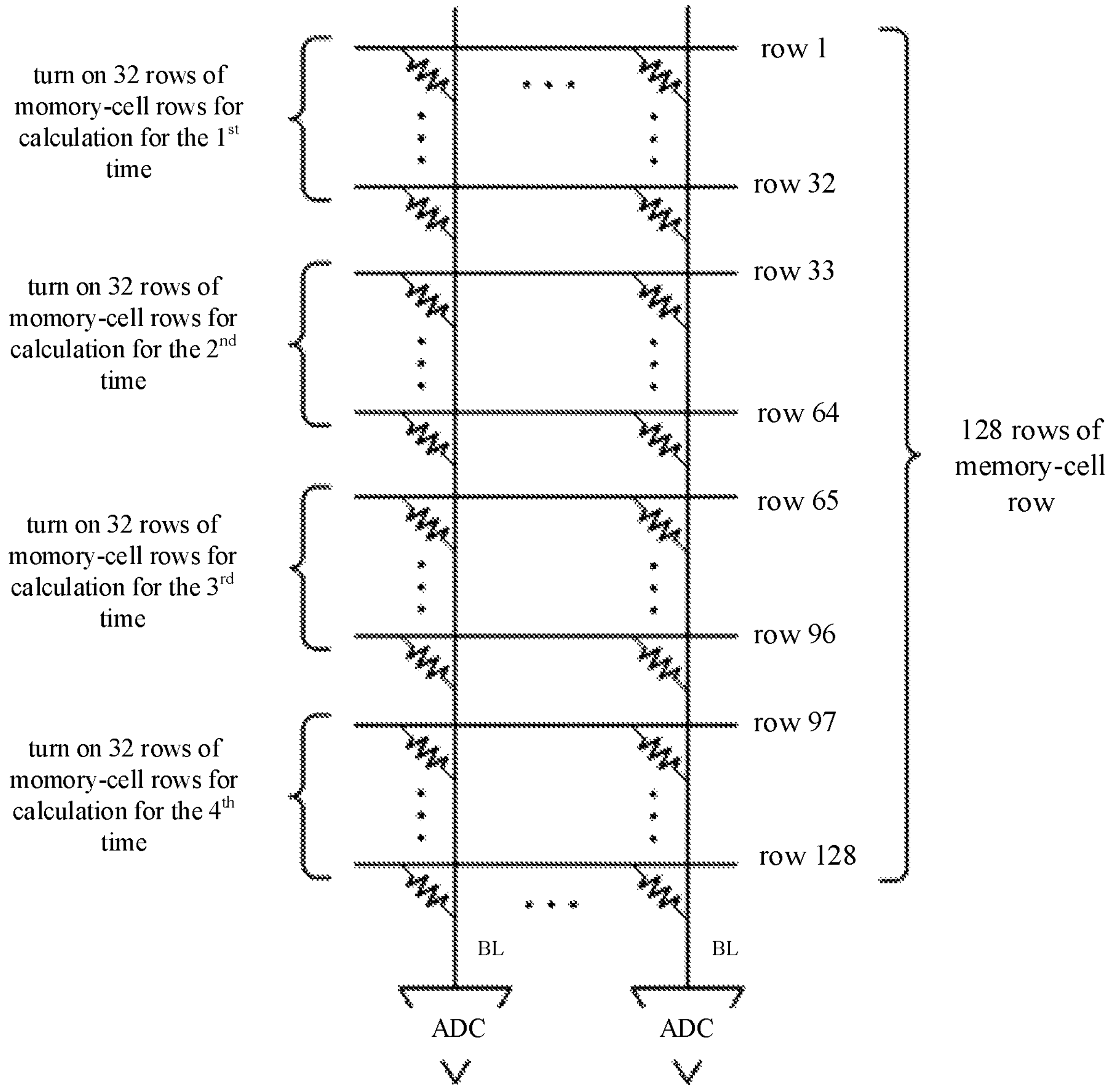
FIG. 2 (Prior Art)
FIG. 2 is a schematic view of a memory array in the prior art.

FIG. 2 is a schematic view of a memory array in the prior art. Referring to FIG. 2, for example, a memory array includes 128 rows of memory-cell rows, and one memory subarray including 32 rows of memory-cell rows is turned on each time for calculation, therefore it is necessary to turn on memory subarrays for four times so that the entire memory array complete computing. Firstly, a first memory subarray including memory-cell rows 1 to 32 is turned on to complete a first calculation; secondly, a second memory subarray including memory-cell rows 33 to 64 is turned on to complete a second calculation; thirdly, a third memory subarray including memory-cell rows 65 to 96 is turned on to complete a third calculation; and fourthly, a fourth memory subarray including memory-cell rows 97 to 128 is turned on to complete a fourth calculation. The farther the memory cell or the memory-cell row which computes is from an analog-to-digital converter (ADC) arranged at the bottom of the CIM circuit, the greater the resistance of the BL is, and the greater the calculation result is affected by the voltage drop in the BL. In such a memory array, the first memory subarray including the memory-cell rows 1 to 32, which is firstly turned on, is the farthest from the ADC at the bottom of the CIM circuit, and therefore is most greatly affected by the BL voltage drop. While the fourth memory subarray including the memory-cell rows 97 to 128, which is fourthly turned on, is the nearest from the ADC at the bottom of the CIM circuit, and therefore is the least affected by the BL voltage drop. Such a memory array affected by unbalanced voltage drops will cause an additional deviation of the final calculation result of the matrix-vector multiplication processed by the memory array.

Figure 3:
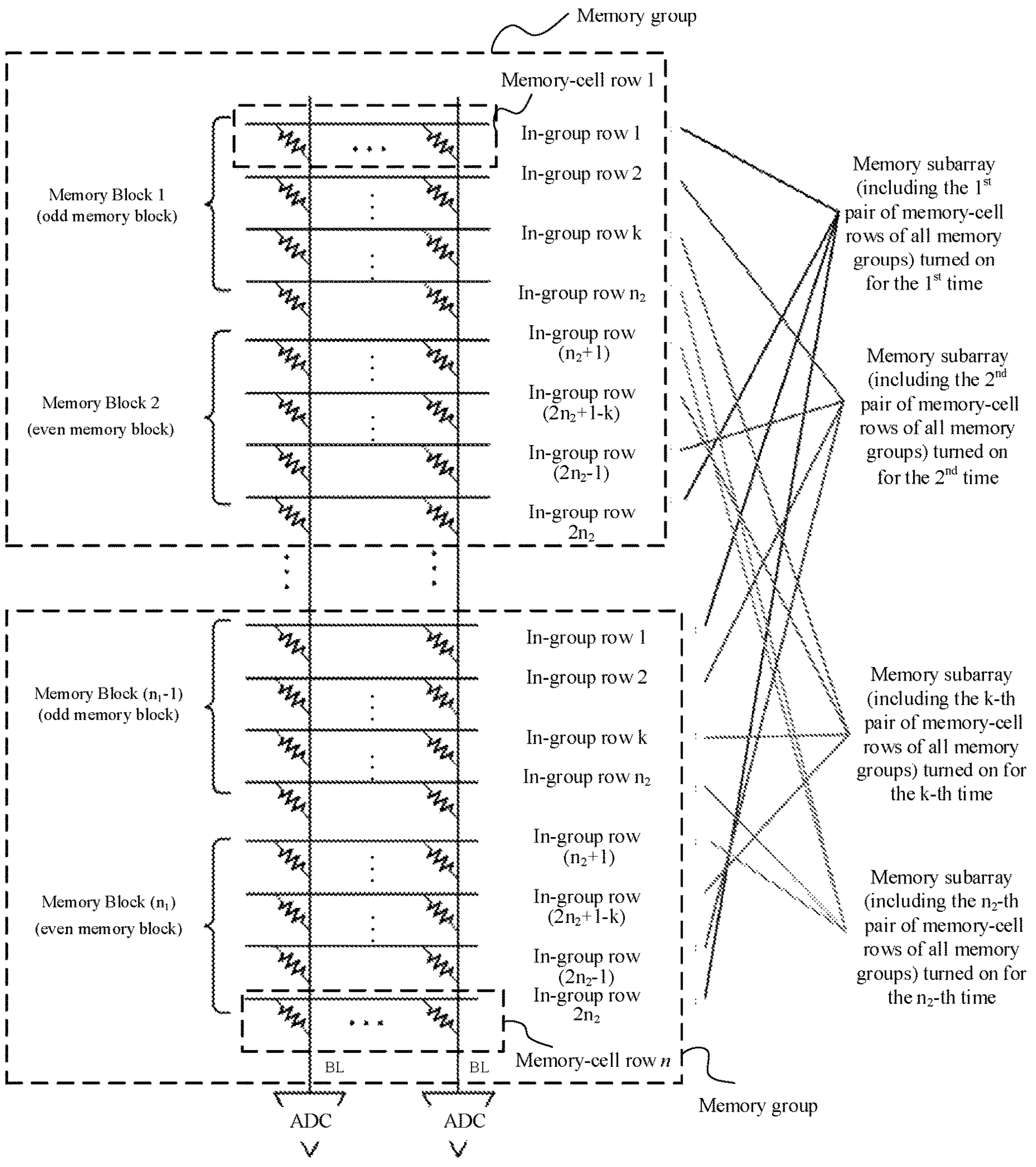
FIG. 3 is a schematic view of a memory array according to an embodiment of the disclosure.

In view of the above existing problems in the prior art, the present disclosure provides a CIM circuit. As shown in FIG. 3, the CIM circuit includes a memory array. The memory array includes $n_1$ memory blocks arranged in sequence from top to bottom, and each memory block includes $n_2$ rows of memory-cell rows arranged in sequence, where $n_1 \geq 2$, $n_2 \geq 1$. In the memory array, each odd memory block and an adjacent even memory block arranged therebelow form a memory group. Each memory group includes $n_2$ pairs of memory-cell rows, and a k-th pair of memory-cell rows in each memory group includes a k-th memory-cell row and a $(2n_2+1-k)$-th memory-cell row in the corresponding memory group, and it is satisfied that $1 \leq k \leq n_2$. The memory array is divided into $n_2$ memory subarrays that are configured to be turned on in sequence for calculation, where a k-th memory subarray includes the k-th pair of memory-cell rows in each memory group. In an embodiment of the disclosure, the $n_2$ rows of memory-cell rows in each memory block are evenly arranged in sequence.

In such an arrangement, when the memory array is computing, the memory subarrays may be controlled to be turned on in turn for calculation. The k-th memory subarray, as an example of the memory subarray controlled to be turned on each time, is formed by the k-th row of memory-cell row and the $(2n_2+1-k)$-th row of memory-cell row selected from each memory group, where $1 \leq k \leq n_2$. Accordingly, for each memory group, a sum of in-group sequence numbers of the memory-cell rows forming a memory subarray is equal to a sum of in-group sequence numbers of memory-cell rows forming any other memory subarray, and the sum is a constant $2n_2+1$. Thus, it may be ensured that, for each memory group, a resistance sum of BLs connecting a pair of memory-cell rows forming a memory subarray to other circuit devices arranged at the bottom is equal to a resistance sum of BLs connecting a pair of memory-cell rows forming any other memory subarray to other circuit devices arranged at the bottom. Accordingly, the memory array is finally divided into $n_2$ non-overlapped memory subarrays, and a sum of in-memory-array row sequence numbers of all memory-cell rows in each memory subarray, is the same, that is, a total resistance of the BLs connecting all memory-cell rows in the memory subarray to other circuit devices arranged at the bottom is the same, thereby effectively balancing the impact of the voltage drop during the calculation of each memory subarray, and reducing the deviation of the calculation result of the memory array caused by the unbalanced voltage drops.

In an embodiment of the disclosure, $n_1$ is an even number, and in other embodiments, $n_1$ may be an odd number, which is not limited in the disclosure.

Figure 4:
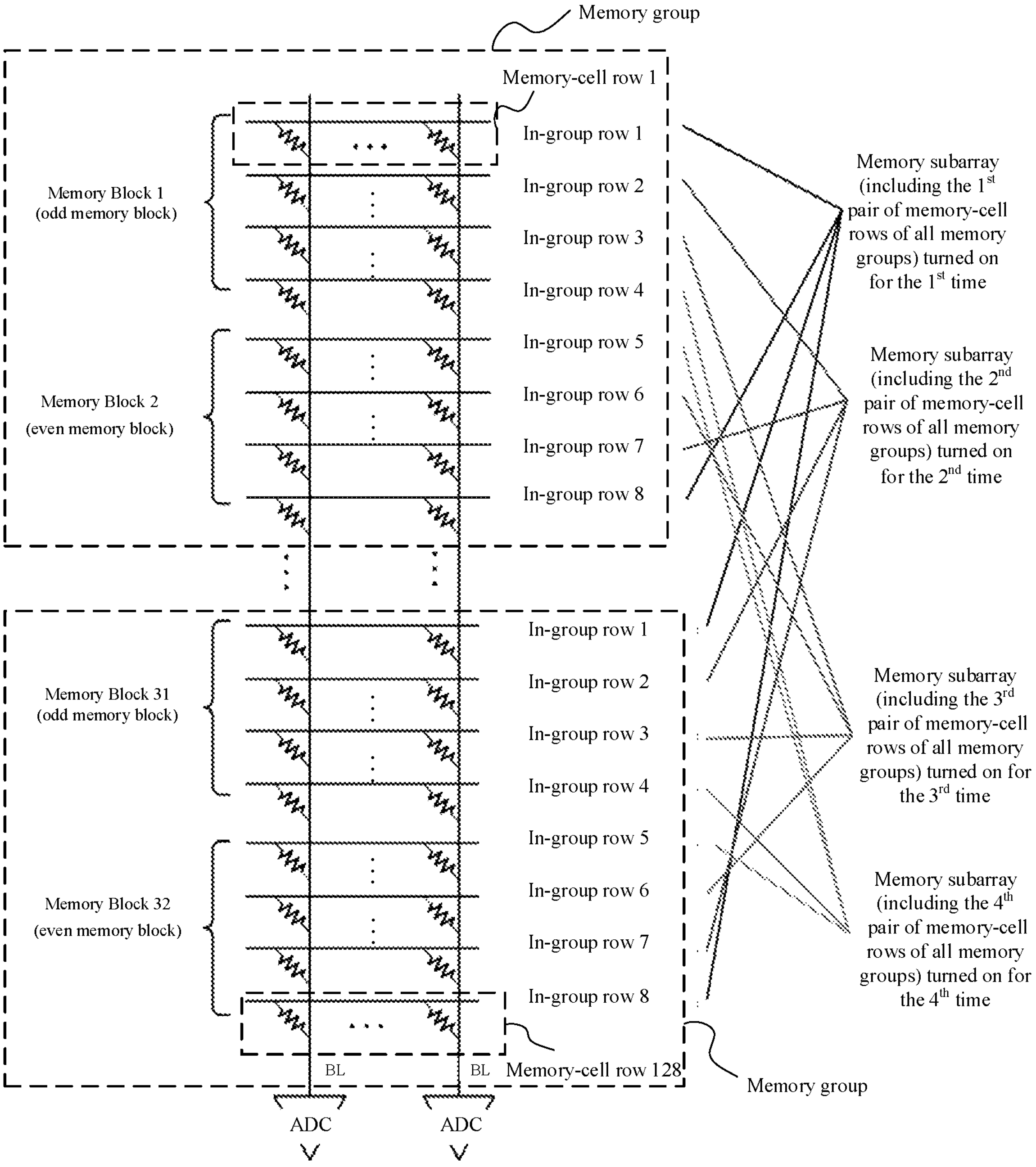
FIG. 4 is a schematic view of the memory array according to another embodiment of the disclosure.

The CIM circuit of the disclosure is described hereinafter in detail by taking a specific memory array as an example. As shown in FIG. 4, the memory array includes 128 rows of memory-cell rows arranged from top to bottom, and is divided into 32 memory blocks arranged from top to bottom in sequence. Each memory block includes four rows of memory-cell rows arranged in sequence. In the memory array, a first memory block and an adjacent second memory block therebelow form one memory group, a third memory block and an adjacent fourth memory block thereof form another memory group, and so on, a $31^{st}$ memory block and an adjacent $32^{nd}$ memory block therebelow form another memory group. In total, 16 memory groups are formed. Each memory group includes four pairs of memory-cell rows, namely eight rows of memory-cell rows, which include an in-group first row of memory-cell row to an in-group eighth row of memory-cell row. In each memory group, the first pair of memory-cell rows include the in-group first and eighth memory-cell rows in the corresponding memory group, the second pair of memory-cell rows include the in-group second and seventh memory-cell rows in the corresponding memory group, the third pair of memory-cell rows include the in-group third and sixth memory-cell rows in the corresponding memory group, and the fourth pair of memory-cell rows include the in-group fourth and fifth memory-cell rows in the corresponding memory group. The memory array is divided into four memory subarrays. The first memory subarray includes the first pairs of memory-cell rows in all 16 memory groups, the second memory subarray includes the second pairs of memory-cell rows in all 16 memory groups, the third memory subarray includes the third pairs of memory-cell rows in all 16 memory groups, and the fourth memory subarray includes the fourth pairs of memory-cell rows in all 16 memory groups. When calculations are performed by the memory array, one memory subarray is turned on each time for calculation. For example, the first memory array, the second memory array, the third memory array, and the fourth memory array are turned on in sequence for calculation. The memory subarrays may be turned on in any other order for calculation, and the specific turning order is not limited by the disclosure.

In an embodiment of the disclosure, as shown in FIG. 3, each memory-cell row includes multiple memory cells.

Figure 5:
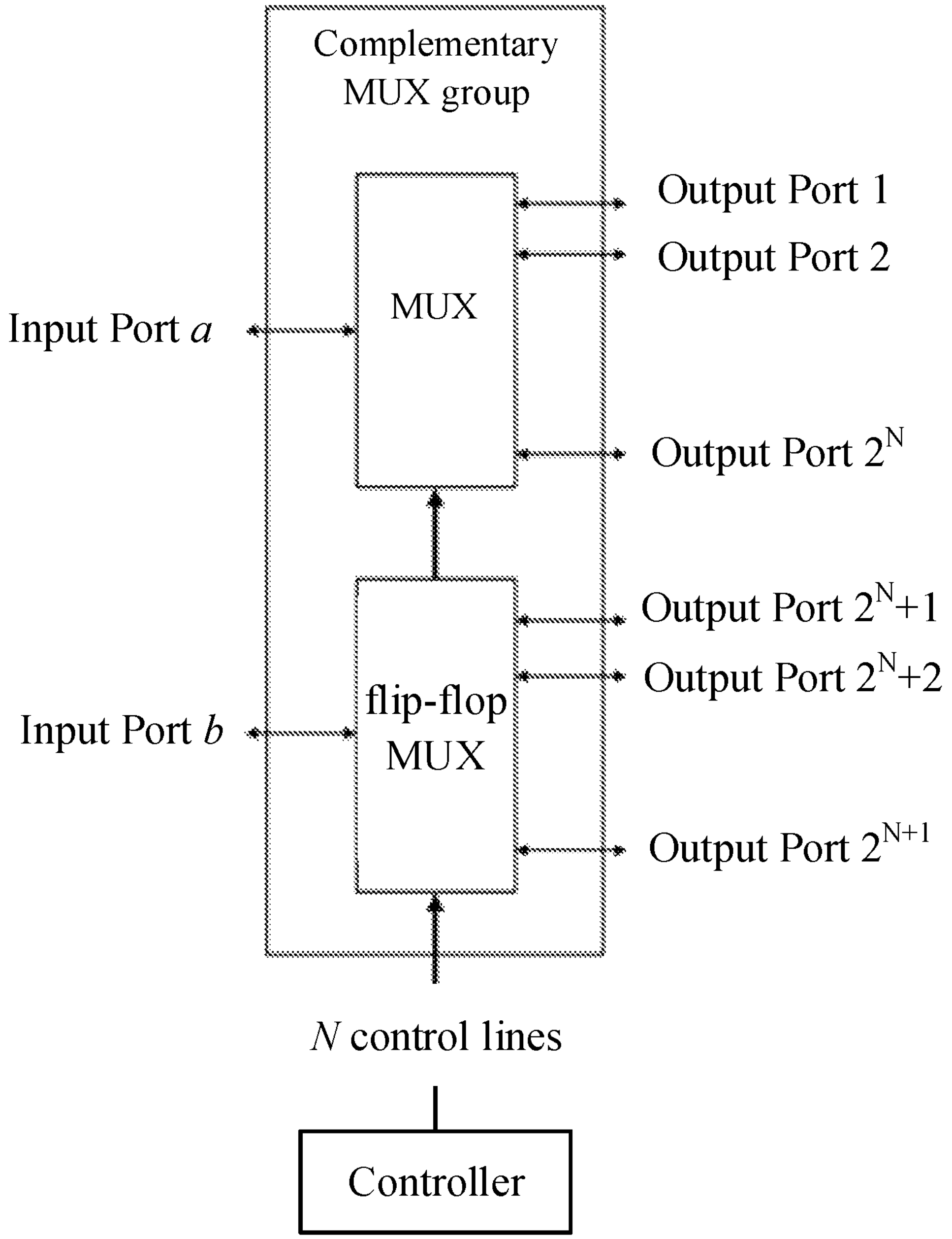
FIG. 5 is a schematic view showing a circuit structure of a complementary MUX group according to an embodiment of the disclosure.

In an embodiment of the disclosure, the CIM circuit further includes multiple complementary Multiplexer (MUX) groups. As shown in FIG. 5, each complementary MUX group includes an MUX and a flip-flop MUX. The outputs of the MUX and the outputs of the flip-flop MUX in each complementary MUX group are connected to the memory-cell rows of a memory group in a one-to-one correspondence.

In one of the embodiments, the outputs of the MUX in each complementary MUX group are connected to the memory-cell rows in the odd memory block of a memory group in a one-to-one correspondence, and the outputs of the flip-flop MUX in the corresponding complementary MUX group are connected to the memory-cell rows in the even memory block of the corresponding memory group in a one-to-one correspondence. Such an arrangement may realize the selection and turning-on of the memory subarrays.

In one of the embodiments, each complementary MUX group includes at least N control lines. Further, in order to make the structure of the CIM circuit simple, the MUX and the flip-flop MUX in each complementary MUX group share the N control lines. In order to realize the selection and turning-on of the memory subarray, the number N of the control lines satisfies that $2^N = n_2$, where, $n_2$ denotes the number of sequentially arranged memory-cell rows included in each memory block.

Referring to FIG. 5, in each complementary MUX group, under the control of the N control lines, the MUX selects an output port from output ports 1 to $2^N$ to be connect to an input port a, and the flip-flop MUX selects an output port from output ports $(2^{N+1})$ to $2^{N+1}$ to be connected to an input port b. When the MUX is controlled by the control lines to select the k-th output port to be connected to the input port a, the flip-flop MUX is controlled to select the $(2^{N+1}+1-k)$-th output port to be connected to the input port b. k is in a range from 1 to $2^N$.

Figure 6:
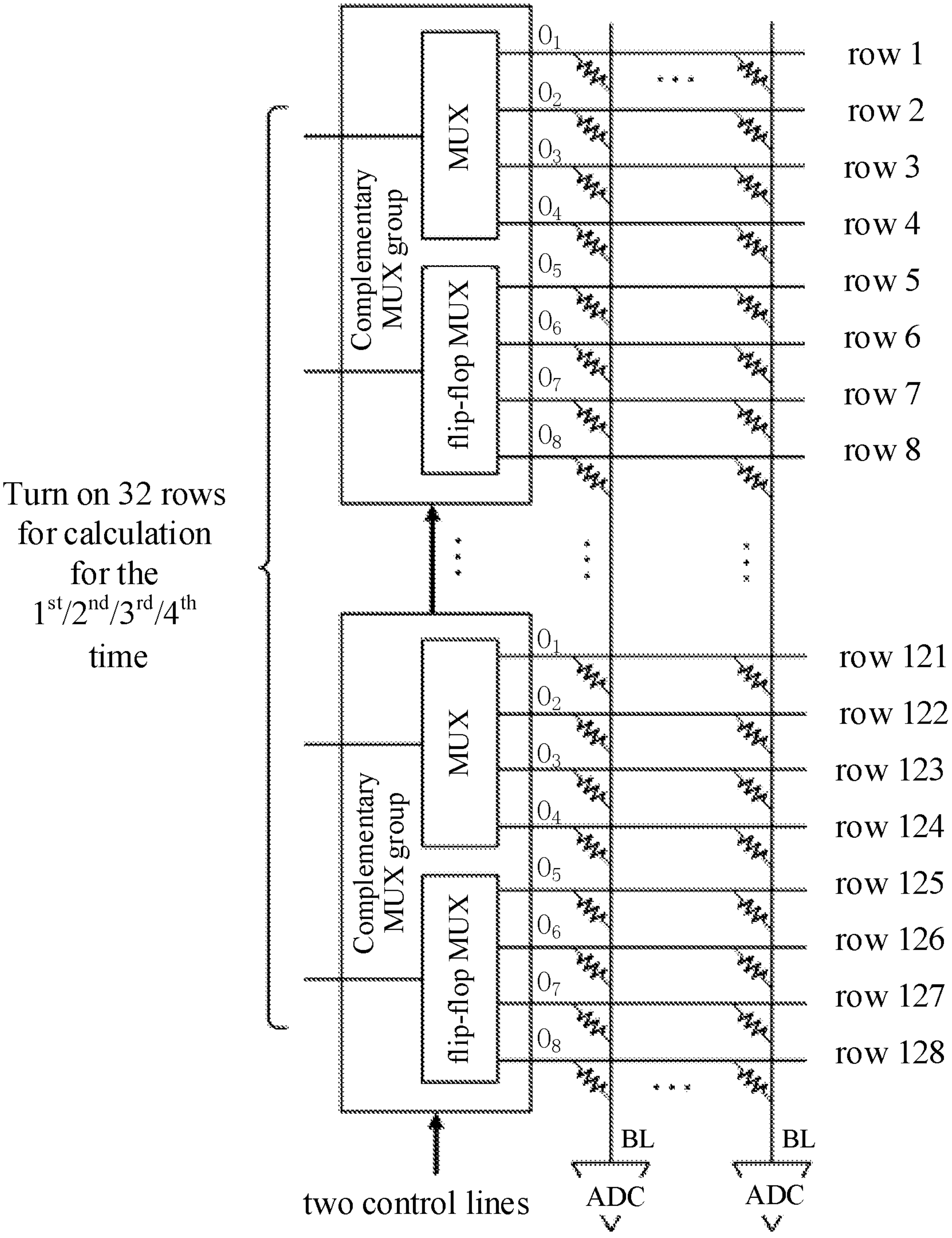
FIG. 6 is a schematic structural view showing a connection between each complementary MUX group and the memory array according to an embodiment of the disclosure.

The CIM circuit of the disclosure is described in detail by taking a specific memory array as an example. Referring to FIG. 6, a memory array includes 128 memory-cell rows, and four memory subarrays of the memory array are turned on in sequence for four times. Each time, 32 memory-cell rows need to be turned on for calculation, and in total, 16 complementary MUX groups are provided. In each complementary MUX group, the N control lines are shared between the MUX and the flip-flop MUX. Taking the configuration in the figure as an example, N=2. The MUX and flip-flop MUX in each complementary MUX group both have four output ports. The four output ports $O_1$ to $O_4$ of the MUX may be connected to four rows of memory-cell rows in the odd memory block of the corresponding memory group in a one-to-one correspondence, and the four output ports $O_5$ to $O_8$ of the flip-flop MUX may be connected to four rows of memory-cell rows in the even memory block of the corresponding memory group in a one-to-one correspondence. When control signals, such as "00", "01", "10", are "11", are inputted in sequence through the control lines, four memory subarrays are selected in sequence for calculation for four times. The sequence of inputting the control signals may be any possible sequence and is not limited in the disclosure.

In an embodiment of the disclosure, as shown in FIG. 5, the CIM circuit further includes a controller, and the controller is connected to each of the complementary MUX groups through the control lines.

As shown in FIG. 6, for each complementary MUX group, a sum of row sequence numbers of two memory-cell rows selected each time is the same. Taking the first complementary MUX group as an example, the 1st memory-cell row and the 8th memory-cell row are selected for the first time, the 2nd memory-cell row and the 7th memory-cell row are selected for the second time, the 3rd memory-cell row and the 6th memory-cell row are selected for the third time, and the 4th memory-cell row and the 5th memory-cell row are selected for the fourth time. For each complementary MUX group, the sum of the row sequence numbers of the two memory-cell rows selected each time is the same. Since the memory-cell rows are arranged from top to bottom in sequence, the sum of resistances of the BLs connecting the two memory-cell rows selected each time to other circuit devices such as the ADCs arranged at the bottom is the same. Therefore, for all complementary MUX groups, a sum of the row sequence numbers of the memory-cell rows selected each time is the same, which means that a total sum of the resistances of the BLs connecting the memory subarray selected each time to other circuit devices such as the ADCs is the same.

Figure 7:
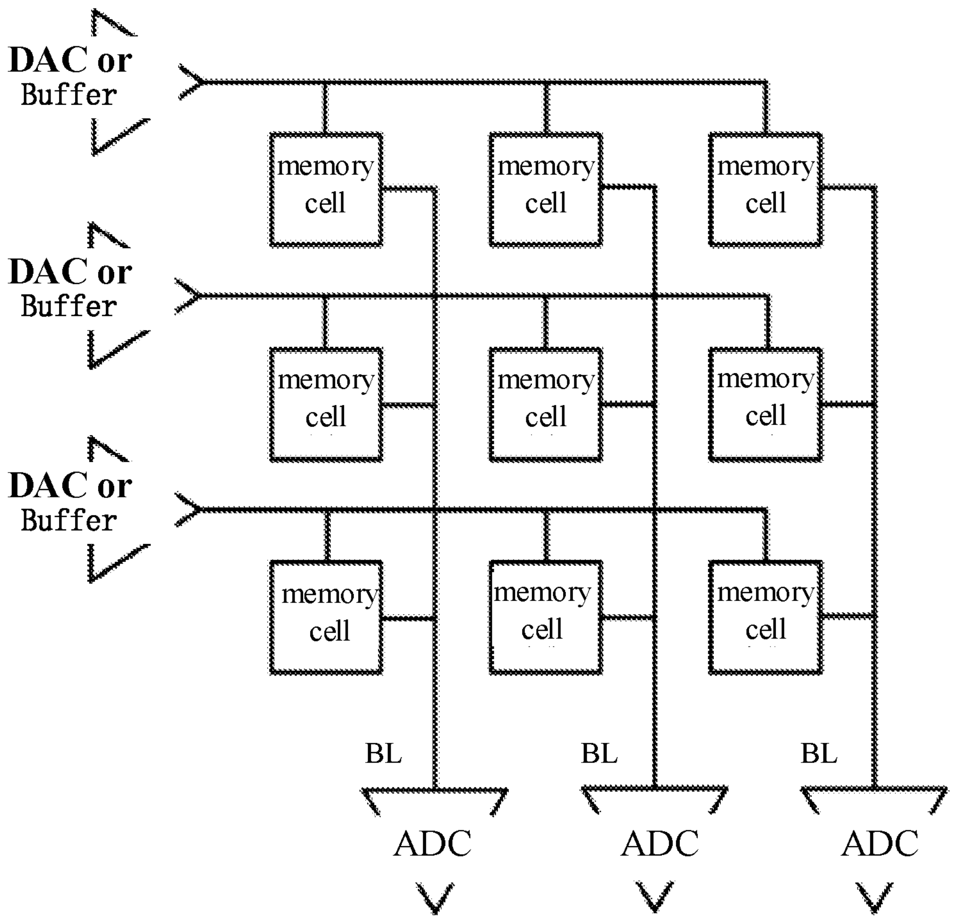
FIG. 7 is a schematic view of the CIM circuit based on the memory array according to another embodiment of the disclosure.

In an embodiment of the disclosure, as shown in FIG. 7, the CIM circuit further includes multiple digital-to-analog converters (DACs) or buffers, and the output of each DAC or buffer is connected to a memory-cell row of the memory array. The inputted digital signal may be converted into a voltage signal by the DAC or processed into a binary voltage signal by the buffer.

Referring to FIG. 7, in an embodiment of the disclosure, the CIM circuit further includes multiple ADCs, and the inputs of the multiple ADCs are connected to the BLs of the memory array, respectively. The calculation results of the memory array are represented by voltages or currents in the BLs, and the ADCs convert the calculation results, such as analog voltages or analog currents, into digital signals and output the digital signals.

In an embodiment of the disclosure, the memory cells are SRAM or DRAM volatile memory cells, or FLASH, RRAM, PCRAM, or MRAM non-volatile memory cells, which are not limited in the disclosure.

Figure 8:
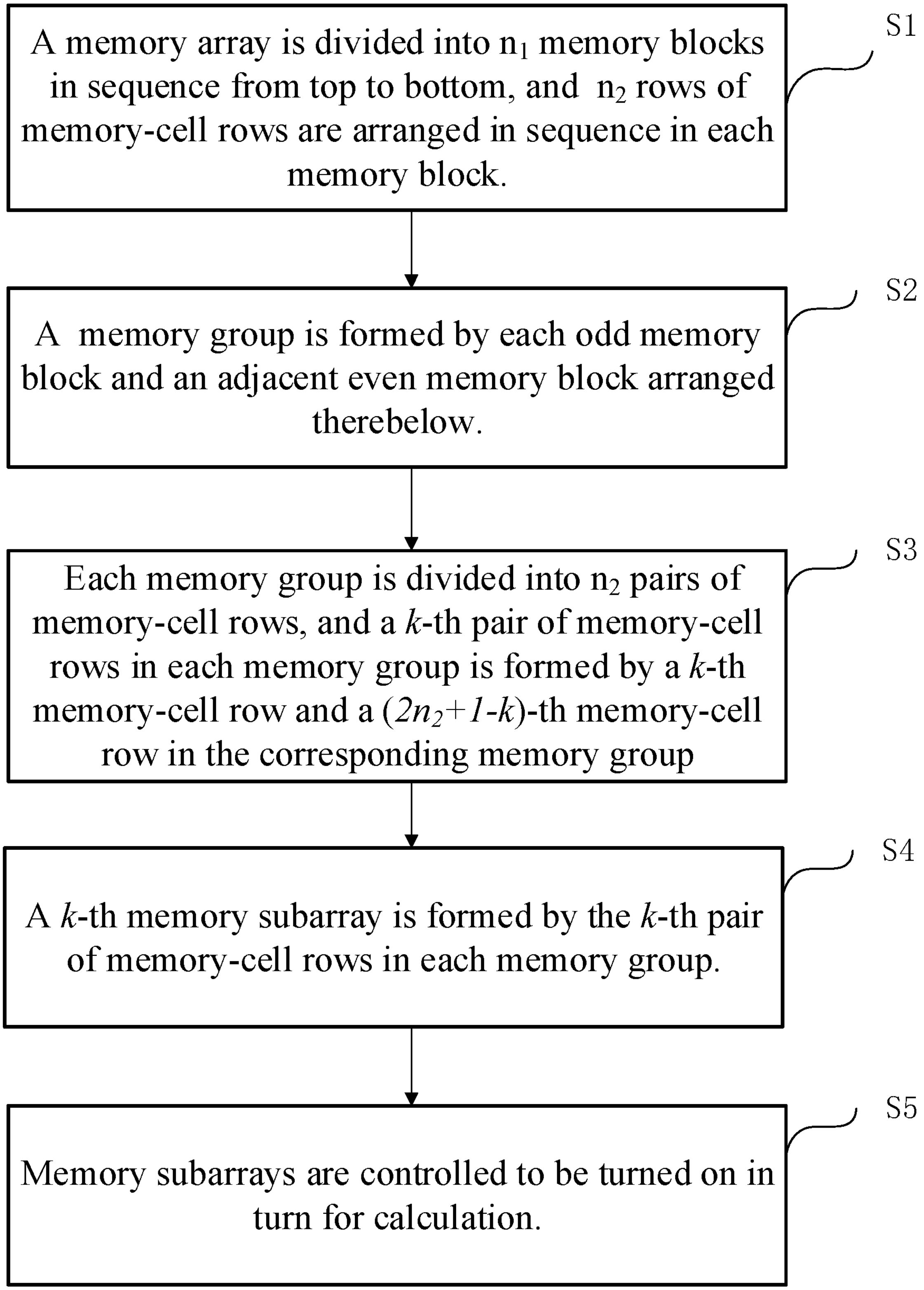
FIG. 8 is a flow chart of a control method of CIM circuit according to an embodiment of the disclosure.

The disclosure further provides a control method of CIM circuit, as shown in FIG. 8, the control method of CIM circuit includes the following steps.

At Step S1, a memory array is divided into $n_1$ memory blocks in sequence from top to bottom, and $n_2$ rows of memory-cell rows are arranged in sequence in each memory block, where $n_1 \geq 2$, $n_2 \geq 1$.

At Step S2, a memory group is formed by each odd memory block and an adjacent even memory block arranged therebelow.

At Step S3, each memory group is divided into $n_2$ pairs of memory-cell rows, and a k-th pair of memory-cell rows in each memory group is formed by a k-th memory-cell row and a $(2n_2+1-k)$-th memory-cell row in the corresponding memory group, and it is satisfied that $1 \leq k \leq n_2$.

At Step S4: a k-th memory subarray is formed by the k-th pair of memory-cell rows in each memory group.

At Step S5: memory subarrays are controlled to be turned on in turn for calculation.

According to the control method of CIM circuit of the present disclosure, when the memory array is computing, the memory subarrays may be controlled to be turned on in turn for calculation. The k-th memory subarray, as an example of the memory subarray controlled to be turned on each time, is formed by the k-th row of memory-cell row and the $(2n_2+1-k)$-th row of memory-cell row selected from each memory group, where $1 \leq k \leq n_2$. Accordingly, for each memory group, a sum of in-group sequence numbers of the memory-cell rows forming a memory subarray is equal to a sum of in-group sequence numbers of memory-cell rows forming any other memory subarray, and the sum is a constant $2n_2+1$. Thus, it may be ensured that, for each memory group, a resistance sum of BLs connecting a pair of memory-cell rows forming a memory subarray to other circuit devices arranged at the bottom is equal to a resistance sum of BLs connecting a pair of memory-cell rows forming any other memory subarray to other circuit devices arranged at the bottom. Accordingly, the memory array is finally divided into $n_2$ non-overlapped memory subarrays, and a sum of in-memory-array row sequence numbers of all memory-cell rows in each memory subarray is the same, that is, a total resistance of the BLs connecting all memory-cell rows in the memory subarray to other circuit devices arranged at the bottom is the same, thereby effectively balancing the impact of the voltage drop during the calculation of each memory subarray, and reducing the deviation of the calculation result of the memory array caused by the unbalanced voltage drops.

When performing calculations in the memory array, the memory subarrays may be controlled to be turned on in turn for calculation. For an example of controlling a memory array including 128 memory-cell rows and turning on four memory subarrays of the memory array for calculation for four times, the first memory subarray, the second memory subarray, the third memory subarray, and the fourth memory subarray are controlled to be turned on, which may be implemented in a manner as follows: the first memory subarray is controlled to be turned on for the first time, the second memory subarray is controlled to be turned on for the second time, the third memory subarray is controlled to be turned on for the third time, and the fourth memory subarray is controlled to be turned on for the fourth time. The four memory subarrays may also be controlled to be turned on in any other order, which is not limited in the disclosure.

In an embodiment of the disclosure, before dividing the memory array into $n_1$ memory blocks in sequence from top to bottom, and arranging $n_2$ rows of memory-cell rows in sequence in each memory block, the control method of CIM circuit also includes: calculating the number of memory blocks to be $$n_1 = \frac{n}{n_2},$$

according to the total row number n of memory-cell rows in the memory array and the number $n_2$ of times of turning on the memory subarrays in sequence for calculation, thereby dividing the memory array into multiple memory blocks.

In an embodiment of the disclosure, controlling the memory subarrays to be turned on in turn for calculation includes: controlling the memory subarrays to be turned on in turn for calculation of matrix-analog-vector multiplication. The control method of CIM circuit of the present disclosure can reduce the deviation of the calculation result of the memory array caused by the unbalanced voltage drops when the memory array is used to perform the matrix-analog-vector multiplication.

In an embodiment of the disclosure, the control method of CIM circuit includes arranging $n_2$ rows of the memory-cell rows in each memory block in sequence at equal intervals, thereby ensuring that when the memory array is used to perform the matrix-analog-vector multiplication, the deviation of the calculation result of the memory array caused by the unbalanced voltage drops may be reduced as much as possible.

The technical features of the embodiments above may be combined arbitrarily. To make the description concise, not all possible combinations of the technical features in the above embodiments are described. However, as long as there are no contradictions in the combinations of these technical features, all of the combinations should be considered to be within the scope of the specification.

The embodiments above only represent several implementation modes of the present application, and the description thereof is relatively specific and detailed, but it should not be construed as limiting the scope of the patent. It should be noted that for those skilled in the art, various modifications and improvements may be made without departing from the concept of the present application, and all these modifications and improvements belong to the protection scope of the present application. Therefore, the scope of protection of the patent application should be subject to the appended claims.

What is claimed is:

1. A compute-in-memory (CIM) circuit, comprising:

a memory array, wherein:

the memory array comprises $n_1$ memory blocks arranged in sequence from top to bottom, and each memory block comprises $n_2$ rows of memory-cell rows arranged in sequence, wherein $n_1 \geq 2$, $n_2 \geq 1$;

each odd memory block and an adjacent even memory block arranged therebelow form a memory group; each memory group comprises $n_2$ pairs of memory-cell rows, and a k-th pair of memory-cell rows in each memory group comprises a k-th memory-cell row and a $(2n_2+1-k)$-th memory-cell row in the corresponding memory group, wherein $1 \leq k \leq n_2$; and the memory array is divided into $n_2$ memory subarrays configured to be turned on in sequence, wherein a k-th memory subarray comprises the k-th pair of memory-cell rows in each memory group; and multiple complementary multiplexer (MUX) groups, each complementary MUX group comprising an MUX and a flip-flop MUX, outputs of the MUX and outputs of the flip-flop MUX in each complementary MUX group being connected to the memory-cell rows of a memory group in a one-to-one correspondence; and a controller connected to each complementary MUX group through a plurality of control lines, wherein each complementary MUX group comprises:

at least N control lines, and the MUX and the flip-flop MUX in each complementary MUX group share the at least N control lines, and $2^N = n_2$; and the controller is configured to:

output control signals to each complementary MUX group to control the $n_2$ memory subarrays to be turn on in turn for calculation, wherein a sum of bitline routing resistances corresponding to the rows of each memory subarray is the same across all $n_2$ memory subarrays to balance voltage drop during sequential calculation.

2. The CIM circuit of claim 1, wherein:

the outputs of the MUX in each complementary MUX group are connected to memory-cell rows in an odd memory block of a memory group in a one-to-one correspondence; and the outputs of the flip-flop MUX in a corresponding complementary MUX group are connected to memory-cell rows in an even memory block of a corresponding memory group in a one-to-one correspondence.

3. The CIM circuit of claim 1, wherein the CIM circuit further comprises multiple digital-to-analog converters (DACs) or buffers, and an output of each DAC or buffer is connected to a memory-cell row of the memory array.

4. The CIM circuit of claim 1, wherein the CIM circuit further comprises multiple ADCs, and inputs of the multiple ADCs are connected to bit lines of the memory array, respectively.

5. The CIM circuit of claim 1, wherein each memory-cell row comprises multiple memory cells.

6. The CIM circuit of claim 1, wherein, $n_1$ is an even number.

7. The CIM circuit of claim 1, wherein the $n_2$ rows of memory-cell rows in each memory block are arranged in sequence at equal intervals.

8. The CIM circuit of claim 5, wherein the multiple memory cells are SRAM or DRAM volatile memory cells, or FLASH, RRAM, PCRAM, or MRAM non-volatile memory cells.

* * * * *